(12) United States Patent
Evans et al.

(10) Patent No.: US 6,650,768 B1
(45) Date of Patent: Nov. 18, 2003

(54) USING TIME RESOLVED LIGHT EMISSION FROM VLSI CIRCUIT DEVICES FOR NAVIGATION ON COMPLEX SYSTEMS

(75) Inventors: Richard James Evans, Underhill, VT (US); Jeffrey Alan Kash, Pleasantville, NY (US); Daniel Ray Knebel, Carmel, NY (US); Phillip J Nigh, Williston, VT (US); Pia Naoko Sanda, Chappaqua, NY (US); James Chen-Hsiang Tsang, White Plains, NY (US); David Paul Vallett, Fairfax, VA (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 09/026,288

(22) Filed: Feb. 19, 1998

(51) Int. Cl.$^7$ .................................................. G06K 9/00
(52) U.S. Cl. ......................... 382/145; 382/149; 348/87; 324/501
(58) Field of Search ................................. 382/145, 149, 382/151, 147; 348/87; 250/559.29, 559.39, 559.4, 559.42, 559.43, 559.44, 559.45; 324/501

(56) References Cited

U.S. PATENT DOCUMENTS

| | | | | |
|---|---|---|---|---|
| 3,868,508 A | * | 2/1975 | Lloyd | 250/330 |
| 4,755,874 A | * | 7/1988 | Esrig et al. | 382/149 |
| 5,672,979 A | * | 9/1997 | Christopher | 324/754 |
| 5,740,272 A | * | 4/1998 | Shimada | 382/149 |
| 5,940,545 A | * | 8/1999 | Kash et al. | 382/312 |
| 5,981,967 A | * | 11/1999 | Luo | 250/559.4 |
| 6,051,828 A | * | 4/2000 | Patterson | 250/214 R |
| 6,172,512 B1 | * | 1/2001 | Evans et al. | 324/752 |

FOREIGN PATENT DOCUMENTS

| | | | | |
|---|---|---|---|---|
| JP | 02-031175 | | 2/1990 | |
| JP | 03-025578 | | 2/1991 | |
| JP | 04373141 A | * | 12/1992 | H01L/21/66 |
| JP | 05-090372 | | 4/1993 | |
| JP | 09-223723 | | 8/1997 | |

OTHER PUBLICATIONS

Kash, J.A., and Tsang, J.C. "Dynamic Internal Testing of CMOS Circuits Using Hot Luminescence." IEEE Electron Device Letters, Jul. 1997, vol. 18, No. 7, pp. 330–332.*

(List continued on next page.)

Primary Examiner—Jon Chang
(74) Attorney, Agent, or Firm—Thu Ann Dang

(57) ABSTRACT

A system and method for determining the location of a particular device on an integrated circuit chip is described. The system and method utilize apparatus for detecting the emission of light during switching events of devices in the circuit during the circuit's processing of an input calculated to actuate the device whose location is desired. Light emissions from the circuit can be temporally and spatially indexed so as to allow deduction, in combination with the a priori knowledge of the logical operation of the circuit, of the location of the desired element. In another embodiment of the invention, a series of images of the circuit can be accumulated, representing the circuit's response to a series of different input signals, each input signal being designed to result in the switching of the desired element. The series of images can be compared to determine the location of the desired element. Also in accordance with the invention, the elements to be located can be either actual functional circuit elements, or fiducials added to the chip for test purposes.

20 Claims, 4 Drawing Sheets

OTHER PUBLICATIONS

Wang et al. "Noninterfering Optical Method of HBT Circuit Evaluation." Electronic Letters. vol. 25, No. 17, pp. 1111–1112, Aug. 1989.*

Iuuzuka et al. "Observation of Minority–Carrier Drift by Infrared Radiation." IEEE Transactions on electron Devices. vol. 37, No. 6, part 1, pp. 1532–1533, Jun. 1990.*

Webb. "Thermal Imaging of Electronic Devices with Low Surface Emissivity." IEE Proceedings–G, Circuits, Devices and Systems, vol. 138, No. 3, pp. 390–400.*

Liu et al. "A New Spectroscopic Photon Emission Microscope System for Semiconductor Device Analysis." Proc. of the 1995 $5^{th}$ Int. Symp. on the Physical and Failurr Analysis of Integrated Circuits, pp. 60–65*

* cited by examiner

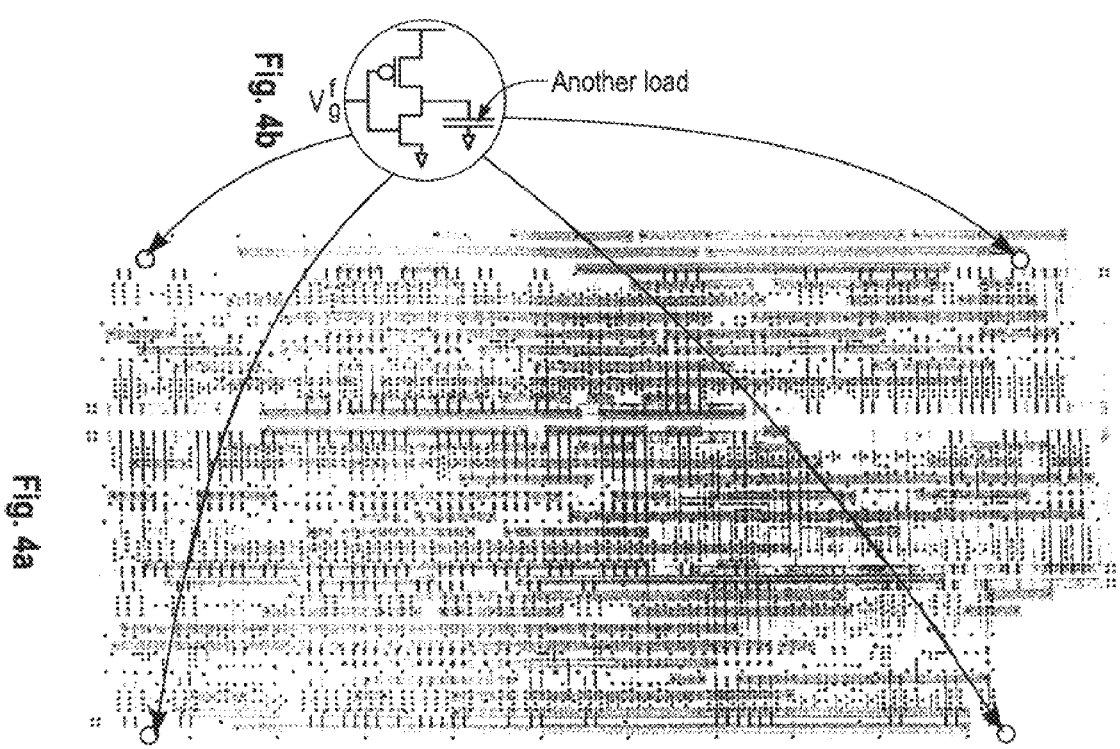

USING TIME RESOLVED LIGHT EMISSION FROM VLSI CIRCUIT DEVICES FOR NAVIGATION ON COMPLEX SYSTEMS

FIELD OF THE INVENTION

The invention relates to semiconductor chip testing apparatus, and more particularly to a system and method for accurately identifying the spatial position of individual components on a functioning VLSI chip.

BACKGROUND OF THE INVENTION

The identification of specific features on a modern integrated circuit chip is extremely difficult given the small physical sizes of the electrical components of the circuits, the similarity in appearance of most components, and their vast numbers. It is expected that the sizes of individual components will continue to shrink and the number of components will continue to increase. Device dimensions of the order of 0.1 microns, and densities in excess of 10,000,000 gates per chip will soon be common in logic chips. An additional complication arises from the fact that the circuits are not designed spatially, but rather logically and schematically. The physical layout of these circuits is done automatically as a complex computerized optimization program following a set of design rules. Therefore, even the designers of the individual parts of the circuit do not necessarily have direct knowledge of the physical layout of their modules. Since chip sizes are of the order of 2 centimeters while individual component placements involve distances on the scale of 0.2 microns, location of an individual component with respect to the edges of the chip can require accuracy in dead reckoning of 1 part in 100,000. Such accuracy is difficult to achieve through simple passive mechanical systems. Similarly, given the complexities of wiring on modern chips, following physical paths from known input and output drivers to a specific device is also extremely difficult and can involve substantial amounts of time. Placement of alignment marks and identifiers such as labels for individual devices is possible but adds complexity to the fabrication and design, and can sacrifice economically valuable area.

Thus, it would be desirable for designers of large scale integrated circuits to be able to precisely identify the position of a particular device on the actual chip if, for instance, it was thought to produce an error in the chip's operation. Alternatively, if it were found that a particular point in a complex circuit were generating an erroneous signal, understanding of the error would require knowledge of the identity of the particular device at that point. In particular, we have recently demonstrated an all optical technique for imaging the switching activity in a switch. We have shown how electrical errors in the operation of a chip could be detected by this technique. It produces an image of the chip which highlights positions where incorrect switching activity occurs. See U.S. patent application Ser. No. 09/026,287, filed Feb. 10, 1998, entitled "Image Processing Methods for Optical Detection of Dynamic Errors in Integrated Circuits" now U.S. Pat. No. 6,172,512 filed on even date herewith. However, full use of this error image requires the ability to map the image onto the actual device positions on the chip. The ability to quickly and precisely identify the devices operating at locations producing faulty imaging signals would allow rapid redesign, resulting in a reduced time to bring fully functional chips to market. Spatial identification of individual devices responsible for operational errors would simplify the process by which faults and failures are analyzed. Clearly, a need has arisen for a technique that would allow any active site on the chip to broadcast its location through an externally detectable signal that could be localized to the site in question. Such a technique would be especially valuable in conjunction with imaging tools which would create pictures of the electrical activity of different points in the chip, and whose interpretation would critically depend on the ability to register the experimentally derived "images" with the layout of devices on the chip.

Commonly owned and copending U.S. patent application Ser. No. 08/683,837, filed Jul. 18, 1996, entitled NONINVASIVE OPTICAL METHOD FOR MEASURING INTERNAL SWITCHING AND OTHER DYNAMIC PARAMETERS OF CMOS CIRCUITS, now U.S. Pat. No. 5,940,545, is incorporated herein by reference.

SUMMARY OF THE INVENTION

It is an object of the present invention to provide a system and method for easily and accurately identifying the location of particular regions and individual components on a viewable physical image of an integrated circuit chip with minimal perturbation on the functional circuit.

It is an object of the present invention to provide a system and method for determining the location of a particular device on a chip by means of applying a particular input or set of inputs to the chip and optically imaging the chip's response.

It is an object of the present invention to provide a system and method for identifying the location of a particular device on a chip by means of the placement of fiducial devices in predetermined locations on the chip and providing input signals to the chip in order to actuate those fiducial devices.

In accordance with the invention a system and method are provided for determining the location of a circuit element in an integrated circuit chip, comprising: selecting a logical input for the circuit that will result in the switching of the element to be located, applying the logical input to the circuit, capturing an image of light emissions resulting from the switching of circuit elements on the chip as the circuit processes the logical input; and using the captured light emissions to identify the location of the device.

BRIEF DESCRIPTION OF THE DRAWING

FIGS. 4a and 4b are a further illustration of the use of a fiducial circuit in accordance with the invention.

DETAILED DESCRIPTION OF A PREFERRED EMBODIMENT OF THE INVENTION

Most modern integrated circuits are based on CMOS devices. These devices draw very little power in their quiescent states. However, it has been demonstrated that when active, each individual switching event generates a short optical pulse which can be detected by modern, highly sensitive photo detectors, The temporal sequence of these optical pulses can be used to label any particular gate in an integrated circuit given either the schematic or the logical design of the circuit.

In accordance with a first embodiment of the invention, the inventors utilize the observation that for any active circuit element in an integrated circuit, a path must exist to that element from one of the inputs to the circuit. Appropriate initiation of the circuit allows the excitation of that element. The location of a particular device can, for instance, be used to deduce the exact location and/or identity of neighboring devices on the chip that may be suspected of failure during testing and/or operation. If the location of a particular correctly-operating device on the chip can be found, and if it is known beforehand—for instance from a schematic of the circuit embodied in the chip—that a device suspected of failure is located near the correctly-operating device, the techniques in accordance with this invention can be used to focus the designer's search for the failing element.

Figure 1:
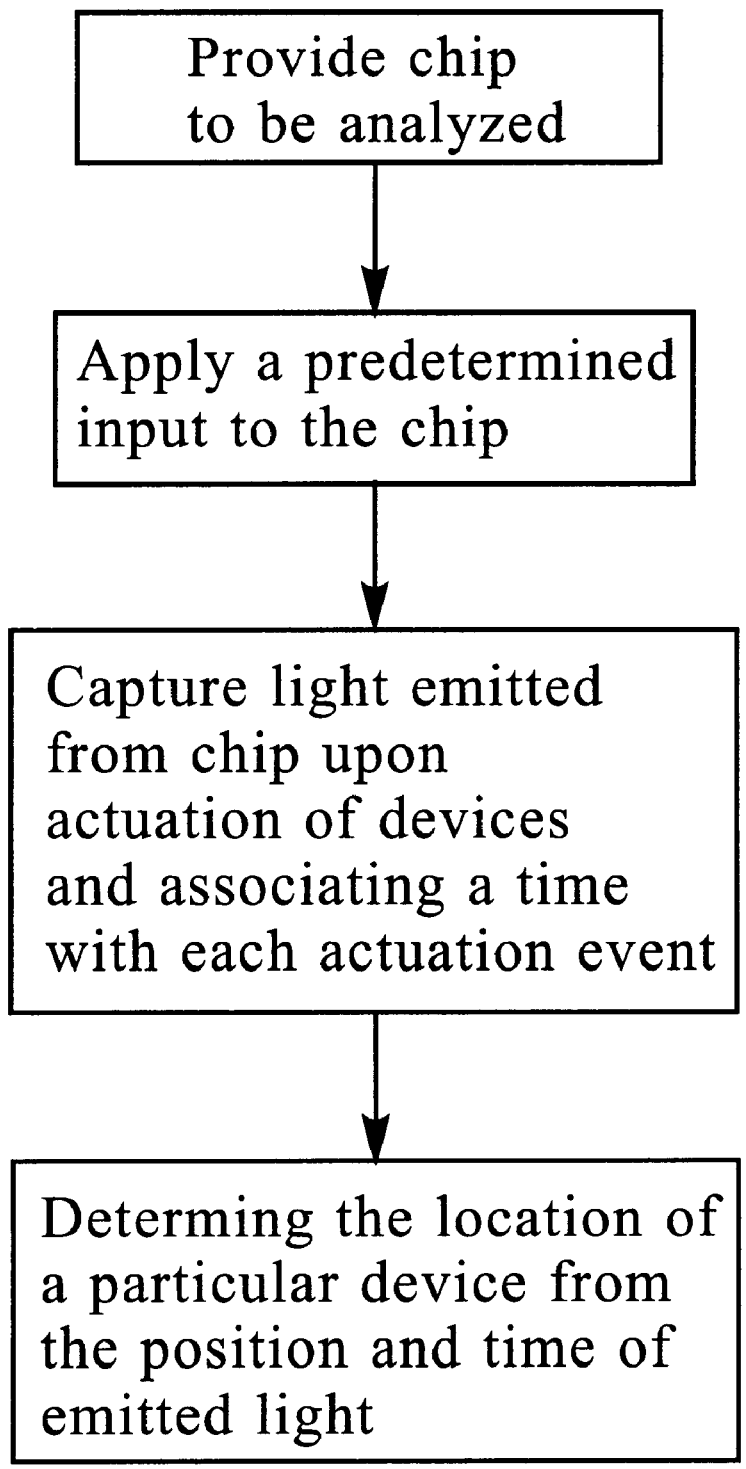
FIG. 1 is a flow diagram of a method for determining the on-chip location of a device according to the present invention.

Referring to FIG. 1, the first embodiment of the invention will now be described. Given a chip to be analyzed, and for which the location of a particular circuit element is desired, a predetermined input will be formulated and applied to the chip. The particular input to be provided is selected with knowledge of the logical design of the circuit, and with the aim of triggering either the device to be located or a device proximate a device to be located. Next, after the input has been applied to the chip, and as logical operations are performed by the circuit's devices in response to that input, light is gathered from the switching of those devices and the location and time of each switching operation is stored, for instance in a memory system of the test apparatus. Because of the designer's knowledge of the logical sequence under which devices in the circuit will operate, the temporal and spatial light information gathered during the processing of the input signal can be used to infer the location of a particular device. That is, from the knowledge of the logical design of the circuit, the designer can expect a particular device to switch at a particular time during the course of the processing of the known input. When the circuit has completed its processing of the input, the designer can review an image of the chip captured at a particular step in the process during which it is known that the device to be located (or a device proximate the device to be located) would have switched, and thereby determine the location of the device.

A system for implementing this process may include an imaging optical detector capable of temporally resolving switching events in the integrated circuit at its normal operating speed. Such a detector was described in U.S. patent application Ser. No. 08/683,837, which has been incorporated herein by reference. In accordance with the present invention, the detected time dependent emission can be stored as a series of data points in a three dimensional space defined by the plane of the circuit and time, and pattern recognition techniques can be used to identify any particular temporal pattern, and the location in the image of this pattern. Such techniques include manual comparison for simple circuits, and automated pattern matching algorithms for more complex designs. For the latter, suitable pattern matching are known in the signal processing and recovery fields.

The result of the signal process is an image of the chip which is dark in the regions showing no switching induced emission, and switching induced emission with an incorrect temporal pattern and light at spots on the chip which show switching induced emission with the correct temporal pattern.

The foregoing steps of the method in accordance with the invention can be performed by suitably programming the image analysis component of a system U.S. patent application Ser. No. 08/683,837.

Figure 2:
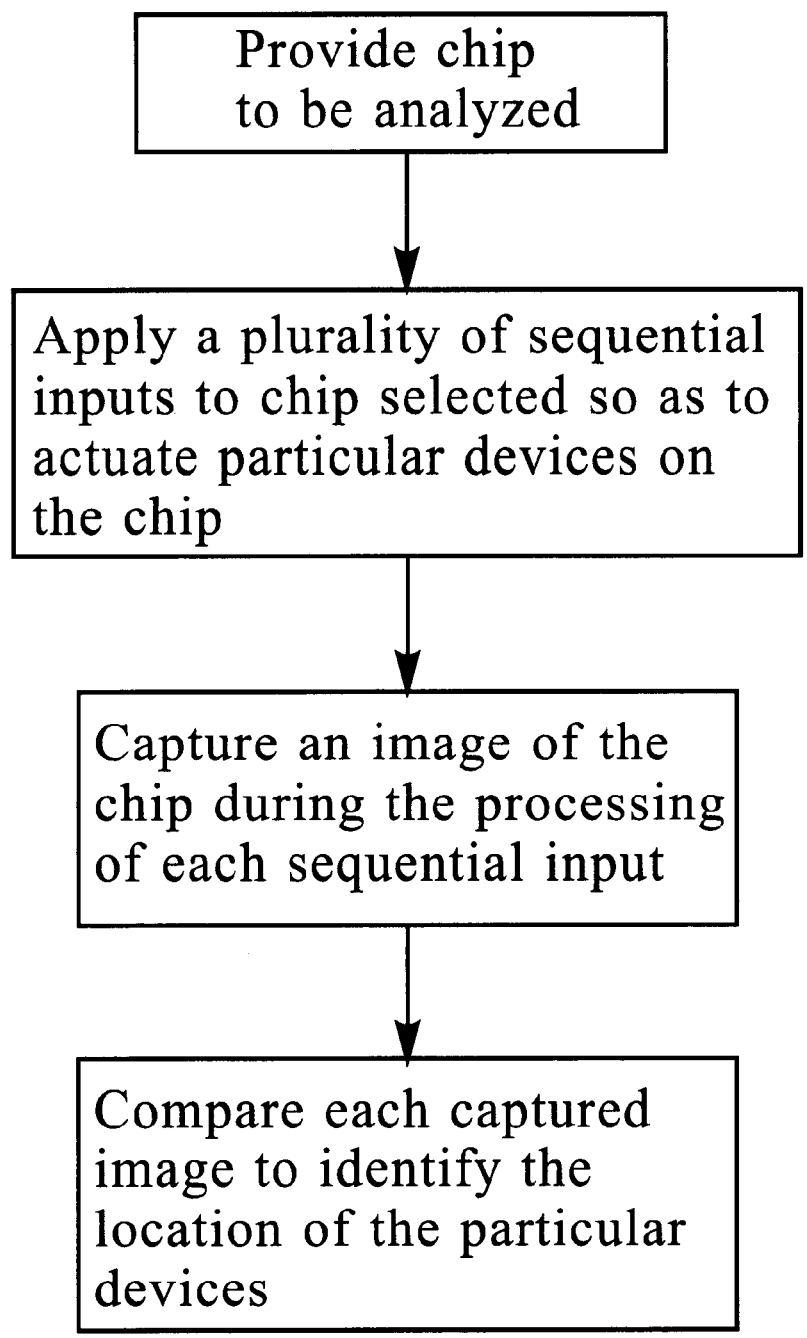
FIG. 2 is a second flow diagram of a method for determining the on-chip location of a device according to the present invention.

In accordance with a second embodiment of the invention, as described in the flow diagram of FIG. 2., a series of different logical inputs can be applied to the chip, with the series of logical inputs being selected so as to identify the location of a particular gate from among a plurality of gates that may be actuated in response to the series of inputs. Appropriate combinations of instructions to the circuit can impose an arbitrary time dependent pattern of switching events on the element in question which can be used to distinguish that element from other circuit elements. For instance, the input and output drivers on a circuit can be directly identified by exciting the relevant input or appropriately terminating relevant output lines. Embedded components will require more complicated instruction sets.

In accordance with this second embodiment of the invention, a series of logical inputs is applied to the circuit. During the processing of each input, an image of the chip is captured, as by accumulating in a single exposure all light emissions from the chip over the course its processing of the input signal. The generated image is stored, and then second and subsequent logical inputs are applied to the chip, and corresponding images captured and stored for each input in like manner. In one implementation, each logical input has as a condition that the device to be located will actuate sometime during the processing of the logical input. When all logical inputs to the circuit have been applied, processed, and their resultant images stored, the images can be compared using image processing techniques to isolate the one or more devices that switched during each of the iterations. Again, this technique can be performed by suitably programming the image analysis component of the system in FIG. 1 or FIG. 2 of U.S. patent application Ser. No. 08/683,837.

In accordance with still another embodiment of the invention, each chip can be populated with fiducial devices in predetermined logical or physical locations throughout the chip. Fiducial devices can be selected to provide a maximum of output light over a minimum area of the chip per switching event so as to facilitate their location, and registration under test conditions. These fiducial devices can be used to supplement the above described techniques, since the devices to be located may not always have ideal light emission characteristics. That is, with the limited quantum efficiency and spectral range of many photocathodes, and other low light photodetectors such as charge coupled devices and photodiodes, the electronic signal levels generated when performing chip imaging can be quite small. Although photons are emitted each time a logic circuit changes state, typically one photon is detected for every million switching events. To obtain a good optical wave form (containing about 1000 photons per switching event) may require one billion or more switching events. At repetition rates below 1 MHz, acquisition times can become unacceptably long, and focusing and navigation can become very time consuming. In addition, obtaining the electrical switching wave form of a circuit from the optical wave form may require calibration of the sensitivity of devices. In accordance with the invention, we describe the use of special devices, referred to as fiducials, placed on a chip for the purpose of providing optical emission to help address these problems.

For an FET in saturation, the hot electron optical emission increases exponentially with the source-drain voltage $V_{DS}$. Also, because of the higher mobility of electrons as compared to holes in silicon FETs, nFETs produce more light than pFETs. As a result, among the simple CMOS logic gates (inverter, NOR, NAND), the inverter produces the most emission, followed by the NOR gate. Hence, if a strong optical signal is desired for analysis of some portion of a circuit, a simple inverter circuit or other circuit which provides strong emission can be added as a fiducial circuit. This element can be designed to minimize load on the circuit under test. With a simple NFET driving a resistive load with a PFET in series for gating the NFET on or off, a strong optical signal can be produced from the NFET whenever the PFET and NFET are biased on. The PFET is intended here as a control pass gate, so that the special fiducial circuit can be switched off when not needed to minimize circuit loading and quiescent current. The conductance of the PFET should be as large as practical to maximize the voltage across (and hence the emission from) the NFET.

Thus, in accordance with the invention, the fiducial circuit need not be of the same type as the logical circuitry on the chip. For example, even though the logical circuitry of the chip is CMOS, it may be advantageous to construct the fiducial circuit from conventional NMOS and PMOS devices. The advantage of using such devices is that they pass current—and therefore generate light detectable by a chip imaging system—even when the devices are not switching, i.e., in a static state.

Figure 3:
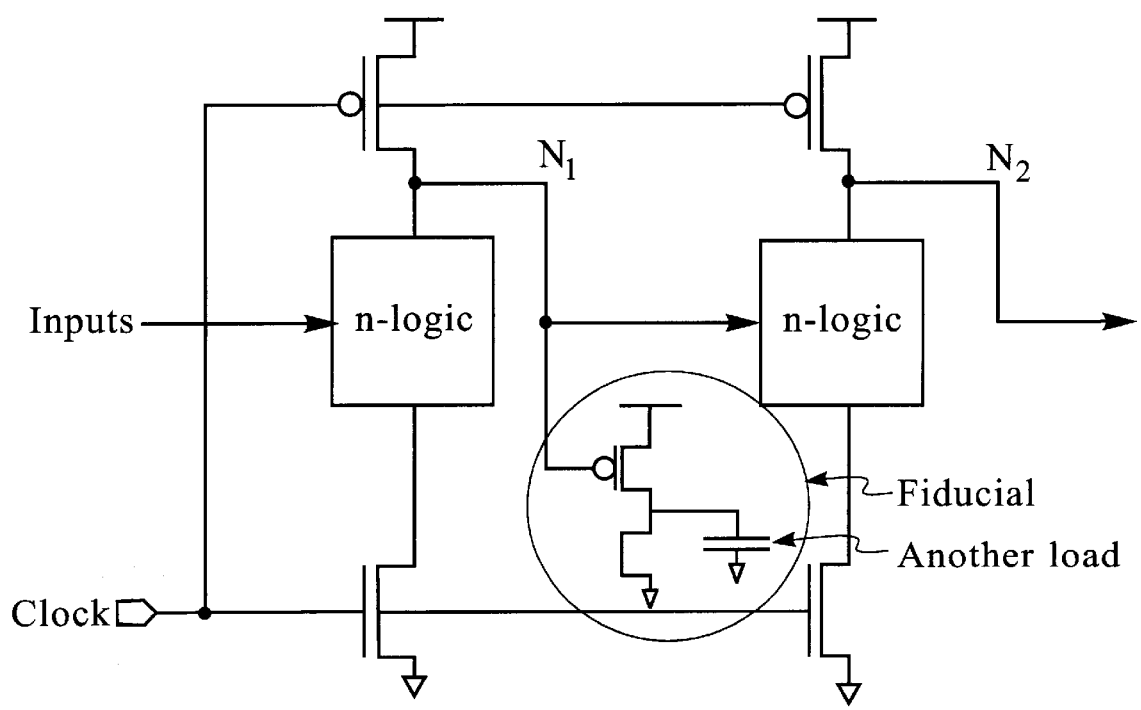
FIG. 3 is a schematic representation of the use of a fiducial circuit in accordance with the invention.

In accordance with the invention, the NFET of such a fiducial circuit can be connected to the logic of the chip circuit to provide an optical wave form. An example fiducial circuit is shown in FIG. 3.

That is, the fiducial circuit can be tied to the actuation of a functional component in the circuit under test. In this embodiment of the system, the fiducial circuit element can be caused to switch by means of an appropriately selected input applied to the logic circuit, as was described with respect to the embodiments of FIGS. 1 and 2.

Alternatively, a dedicated fiducial circuit can be constructed on the chip, with the devices of the fiducial circuit being located in desired locations throughout the chip. An example of this technique is shown in FIGS. 4a and 4b.

Such a dedicated circuit will be supplied by dedicated input lines, which are separate from the input lines used to provide logical inputs to the functional circuitry of the chip.

The fiducial elements in accordance with the invention can be driven indirectly or directly by an electrical input to the chip to allow their use as navigation "beacons". To enable detection of the fiducial circuit in the event other circuit elements are also producing emission, a unique and recognizable input pattern can be applied, resulting in an easily detectable optical wave form. In addition to navigation, a bright fiducial device can be used as an aid in focusing. Further, in order to convert the optical wave form into a voltage wave form, the fiducial could be used as an intensity calibration standard. If there are several such fiducials across a chip, or any other emission structure which is repeated at various places on the chip, such structures can be used to measure the uniformity processing. If the fiducial device were bright enough, it could even function as a timing trigger reference, although this would require detection of typically nearly 1 photon from the fiducial device per logic switch.

In further accordance with the present invention, the acquired location of elements in accordance with the disclosed techniques can be used as registration points for overlaying one acquired image on another acquired image, for purposes of comparison. That is, once the locations of various devices have been determined, those locations can be used as accurate reference points for comparison of the image with later acquired images. These reference locations can be preserved even during manipulation of the image, such as by enlargement.

While the invention has been described in particular with respect to preferred embodiments thereof, it will be understood that modifications to those embodiments can be effected without departing from the spirit and scope of the invention.

What is claimed is:

1. A method for determining the location of a circuit element in an integrated circuit chip, comprising:
   selecting a logical input for the integrated circuit chip that will result in the switching of the element to be located;
   applying the logical input to the integrated circuit chip;
   capturing an image of light emissions resulting from the switching of circuit elements on the integrated circuit chip as the integrated circuit chip processes the logical input;
   using the captured light emissions to identify the location of the circuit element to be located; and
   for each emission of light from the chip, storing data indicating the location on the chip from which the emission originated along with data indicating the time of the emission.

2. The method of claim 1, wherein the step of capturing comprises capturing a separate image of the chip at one or more times during the processing of the logical input.

3. The method according to claim 1, wherein the step of using the captured light to identify the location of the circuit element comprises identifying from the stored data each instance of light emission corresponding to a time at which light is expected to be emitted from the circuit element to be located.

4. The method of claim 1, wherein the logical input comprises a group of sequentially applied signals selected so as to actuate the circuit element to be located.

5. The method of claim 4, wherein the step of identifying the location of the circuit element comprises comparing two or more images of light emissions resulting from the switching of circuit elements on the chip, each of the sequentially applied signals producing a corresponding image of light emissions.

6. A method for determining the location of a circuit element in an integrated circuit chip, comprising:
   selecting a logical input for the integrated circuit chip that will result in the switching of the element to be located;
   applying the logical input to the integrated circuit chip;
   capturing an image of light emissions resulting from the switching of circuit elements on the integrated circuit chip as the integrated circuit chip processes the logical input; and
   using the captured light emissions to identify the location of the circuit element to be located;
   wherein the chip includes one or more fiducial elements disposed on the chip in predetermined locations.

7. The method of claim 6, wherein each fiducial element is a part of the integrated circuit chip, and is designed to actuate in response to an input to the integrated circuit chip.

8. The method of claim 6, wherein each fiducial element is part of a circuit that is separate from normal operating components of the integrated circuit chip, said fiducial element including at least one separate, distinct input, said at least one input being distinct from the normal operating components of the integrated circuit chip.

9. The method of claim 7, wherein the fiducial is capable of generating detectable light when in a static state.

10. The method of claim 6, wherein the fiducial elements are switched in succession, whereby an orientation of the circuit under test may be determined from at least one of a location and timing of the captured light emissions.

11. The method of claim 8, wherein the fiducial is capable of generating detectable light when in a static state.

12. A method for determining the location of a circuit element in an integrated circuit chip, comprising:

selecting a logical input for the integrated circuit chip that will result in the switching of the element to be located;

applying the logical input to the integrated circuit chip;

capturing an image of light emissions resulting from the switching of circuit elements on the integrated circuit chip as the integrated circuit chip processes the logical input; and using the captured light emissions to identify the location of the circuit element to be located;

wherein the logical input comprises a group of sequentially applied signals selected so as to actuate the circuit element to be located; and wherein the step of capturing comprises, for each of the sequentially applied logic signals, accumulating as a single image the light emitted from the chip over the course of the circuit's processing of the logical input signal.

13. A method for determining the location of a circuit element in an integrated circuit chip, comprising:

selecting a logical input for the integrated circuit chip that will result in the switching of the element to be located;

applying the logical input to the integrated circuit chip;

capturing an image of light emissions resulting from the switching of circuit elements on the integrated circuit chip as the integrated circuit chip processes the logical input; and using the captured light emissions to identify the location of the circuit element to be located;

wherein the logical input comprises a group of sequentially applied signals selected so as to actuate the circuit element to be located;

wherein the step of identifying the location of the circuit element comprises comparing two or more images of light emissions resulting from the switching of circuit elements on the chip, each of the sequentially applied signals producing a corresponding image of light emissions; and wherein the chip includes one or more fiducial elements disposed on the chip in predetermined locations.

14. The method of claim 13, wherein each fiducial element is a part of the integrated circuit chip, and is designed to actuate in response to an input to the integrated circuit chip.

15. The method of claim 13, wherein each fiducial element is part of a circuit separate from the circuit under test and residing on the same integrated circuit chip, and wherein said fiducial element includes a separate input for activating the fiducial element.

16. The method of claim 14, wherein the fiducial is capable of generating detectable light when in a static state.

17. The method of claim 13, wherein the step of identifying the location of the circuit element comprises locating a fiducial element proximate the circuit element to be located.

18. The method of claim 15, wherein the fiducial is capable of generating detectable light when in a static state.

19. A method for determining the location of a circuit element in an integrated circuit chip, comprising:

selecting a logical input for the integrated circuit chip that will result in the switching of the element to be located;

applying the logical input to the integrated circuit chip;

capturing an image of light emissions resulting from the switching of circuit elements on the integrated circuit chip as the integrated circuit chip processes the logical input; and using the captured light emissions to identify the location of the circuit element to be located;

wherein the location of the circuit element to be located is used as a reference point for comparison of the image of light emissions resulting from the switching of circuit elements on the chip with later captured images.

20. A system for determining the location of a circuit element in an integrated circuit chip, comprising:

means for applying a logical input to the integrated circuit chip, the logical input selected such that it will result in the switching of the circuit element to be located;

means for capturing an image of light emissions resulting from the switching of circuit elements on the integrated circuit chip as the integrated circuit processes the logical input;

means for using the captured light emissions to identify the location of the circuit element to be located; and means for storing data indicating, for each emission of light from the chip, the location on the chip from which the emission originated along with data indicating the time of the emission.

* * * * *